United States Patent [19]
Busack et al.

[11] Patent Number: 4,942,576
[45] Date of Patent: Jul. 17, 1990

[54] BADBIT COUNTER FOR MEMORY TESTING

[75] Inventors: Jon P. Busack; Gary M. Johnson; Richard R. Clem, all of Boise, Id.

[73] Assignee: Micron Technology, Inc., Boise, Id.

[21] Appl. No.: 261,611

[22] Filed: Oct. 24, 1988

[51] Int. Cl.⁵ .......................................... G01R 31/28
[52] U.S. Cl. .................... 371/21.2; 365/200; 365/201; 371/5.1; 371/25.1
[58] Field of Search ............... 371/21.2, 25.1, 5.1; 365/200, 201

[56] References Cited

U.S. PATENT DOCUMENTS

| | | | |
|---|---|---|---|
| 3,636,443 | 1/1972 | Singh et al. | 371/25.1 |
| 3,887,869 | 6/1975 | Connolly et al. | 371/25.1 |
| 4,001,818 | 1/1977 | Radichel et al. | 371/25.1 |
| 4,122,995 | 10/1978 | Franke | 371/25.1 |
| 4,183,459 | 1/1980 | Donn et al. | 371/25.1 |
| 4,620,302 | 10/1986 | Binoeder et al. | 371/25.1 |
| 4,654,850 | 3/1987 | Rodrigues et al. | 371/25.1 |
| 4,710,932 | 12/1987 | Hiroshi | 371/25.1 |
| 4,752,929 | 6/1988 | Kantz et al. | 371/21.2 |
| 4,791,357 | 12/1988 | Hijduke | 371/25.1 |

*Primary Examiner*—Charles E. Atkinson
*Attorney, Agent, or Firm*—Jon P. Busack; Stan Protigal; Angus Fox

[57] ABSTRACT

Apparatus for comparing outputs of two digital devices and counting digital aberrations between them. One embodiment of this invention is the use of an XOR gate to compare the output of a DRAM under test to the output of a known good DRAM of corresponding operating characteristics, and the use of a counter to count the digital aberrations, known as badbits, between the two DRAMs.

4 Claims, 5 Drawing Sheets

BADBIT COUNTER FOR MEMORY TESTING

FIELD OF THE INVENTION

This invention relates to automated test equipment for semiconductor devices, specifically in the area of error detection.

BACKGROUND OF THE INVENTION

This invention was developed for use in testing DRAMs, a type of memory integrated circuit, also called a chip. One chip can store thousands of bits. As the chips are manufactured, a method of classifying failures is necessary to improve the production process.

One way to classify a failing memory chip is to count how many "badbits" are in the chip. A good memory chip will faithfully store and retrieve a bit at any location within the chip. A failing memory chip will have one or more locations that do not store or retrieve bits successfully. A faulty location such as this is called a "badbit". Clearly, a memory chip with only one badbit is much closer to functioning than a memory chip with a thousand badbits. Hence, the ability to count badbits is very helpful in identifying failure modes and providing feedback to the production process to minimize those failure modes.

Many commercially available memory testers are able to count badbits, but this can cost extra and can take more test time. The badbit counter described herein is useful as a low-cost addition to any memory tester to add efficient badbit counting ability.

Although the preferred embodiment tests memory circuits, this invention could be used to test any digital device simply by simultaneously comparing the outputs of a known good device with the outputs of a device under test.

Prior art includes a similar technique but a different application, as shown in U.S. Pat. No. 4,752,929/Kantz, et al., which describes methodology and evaluation circuitry for operating a semiconductor memory having test-mode capability. (A chip with test-mode ability can read or write internal multiple bits simultaneously which are normally singly addressed, and provide an output signal indicating when the paralleled bits are not identical, indicating a badbit. The purpose of a test-mode is to reduce testing time, particularly for larger semiconductor memory devices.)

The similarity between the instant claims and those of Kantz, et al., is the comparison of a memory cell under test to a reference memory cell through an XOR gate, and the use of the output signal of the XOR gate to indicate digital discrepancies between said cells.

The differences are:

(1) Kantz, et al., direct their device for use within a particular semiconductor memory device. The instant invention is separate from the device under test, and can be used to test any memory device, as well as other digital devices, or an analog device fed through an analog-to-digital converter.

(2) Kantz, et al., created their invention primarily for test-mode circuitry and methods. The instant invention was created primarily for efficient classification of failures (via badbit counting). The instant invention can be used regardless of the test-mode capability of the device under test.

SUMMARY OF THE INVENTION

The badbit counter can be interfaced to any electronic clocking device used to test or exercise memory circuits, to add efficient badbit counting ability.

The first prototype built comprised a digital counter, a reference DRAM, a digital display, and wires interfacing the badbit counter circuit to the tester and to a memory chip being tested (also called a Device Under Test, or DUT). The DUT output and the reference DRAM output were tied to the inputs of a 2-input XOR gate. The XOR output was connected to the counter input. The effect was that the counter incremented only when the DUT produced a different output than the reference DRAM, indicating a badbit. The count was displayed on the digital display. Pressing a button cleared the counter to zero.

The circuit was then modified for a production environment, which means that the badbit counter outputs and controls were interfaced to the tester. Since the tester used did not have enough input ports, a parallel-in/serial-out shift register was added. The register's parallel inputs were connected to the counter's parallel outputs, and the register output was inputted to the tester. The tester, properly programmed, could automatically clear and enable the badbit counter, exercise the DUT, latch the resulting badbit count into the shift register, and serially shift the badbit count from the register into the tester.

A "flagbit" was added to improve efficiency. If there were no badbits, the counter outputs and the flagbit would all remain at zero. If the counter was incremented at least once, the flagbit would latch high. This meant the tester could determine if the DUT passed or failed by the status of one flagbit, without taking time to shift in and process several bits. The counter need be shifted only if the flagbit indicated that at least one badbit occurred.

DETAILED DESCRIPTION OF THE PREFERRED EMBODIMENT

Figure 1:
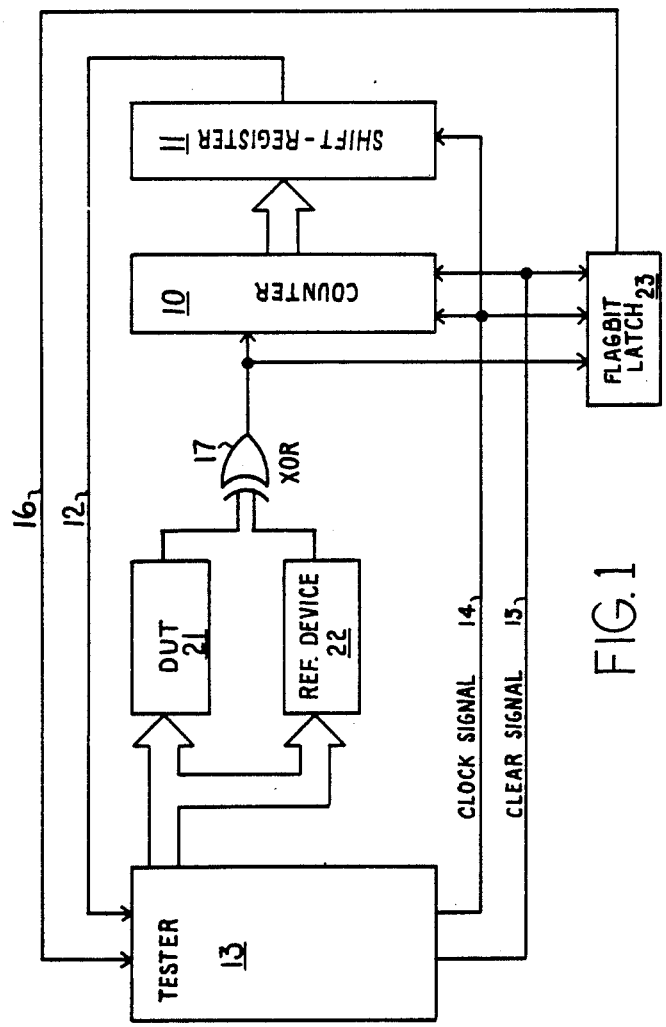
FIG. 1 is a block diagram of the badbit counter, including the flagbit latch and the shift register.

FIG. 1 shows the basic configuration of the preferred embodiment. A tester 13 drives a DUT 21 and an equivalent reference device 22 in parallel. The DUT 21 output and the reference device 22 output feed into a 2-input XOR gate 17, which provides a count input for a counter 10, and a latch input for a flagbit latch 23. The counter 10 outputs in parallel to a shift register 11. The counter 10, shift register 11, and flagbit latch 23 are clocked by a clock signal 14. The counter 10 and flagbit latch 23 are cleared by a clear signal 15. The shift register 11 serially outputs to the tester 13 through a wire 12, and the flagbit latch 23 outputs to the tester 13 through a wire 16.

Figure 2A:
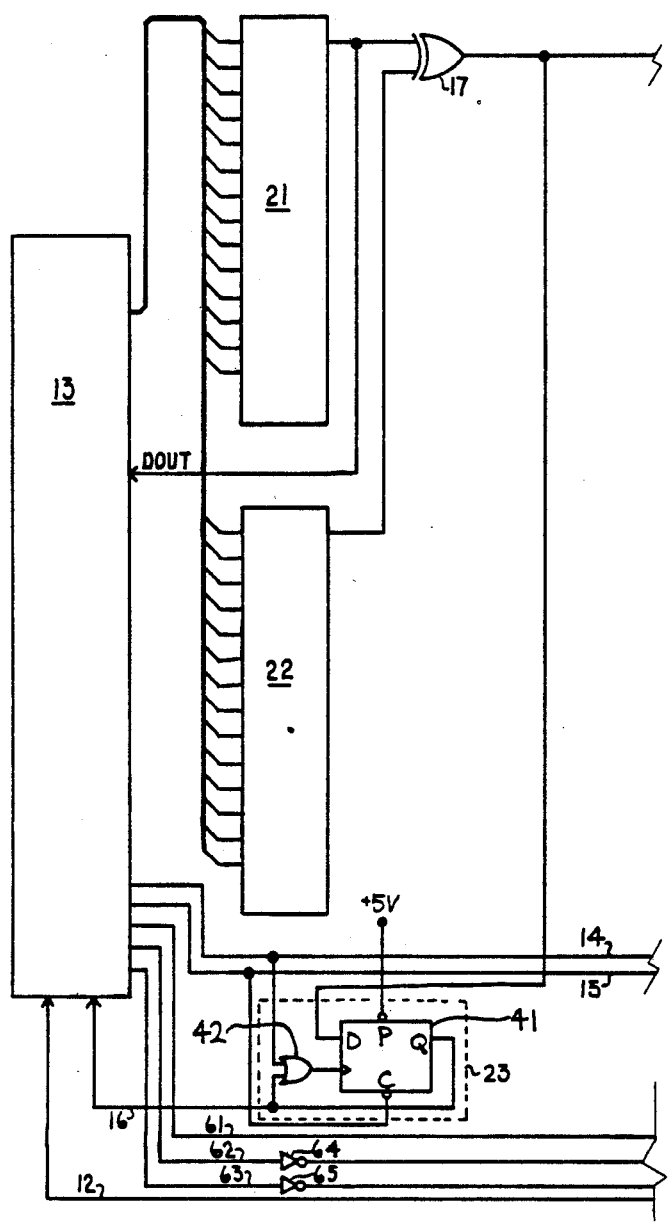
FIGS. 2a, 2b, and 2c together are a complete schematic of the preferred embodiment.
Figure 2B:
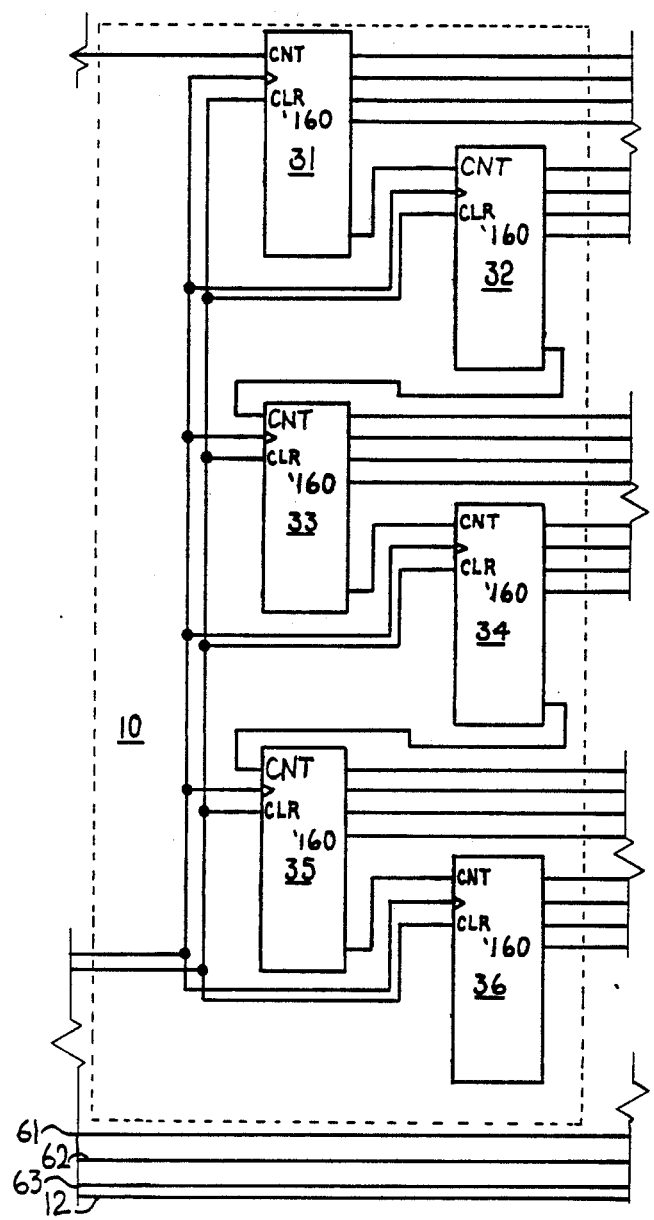
Figure 2C:
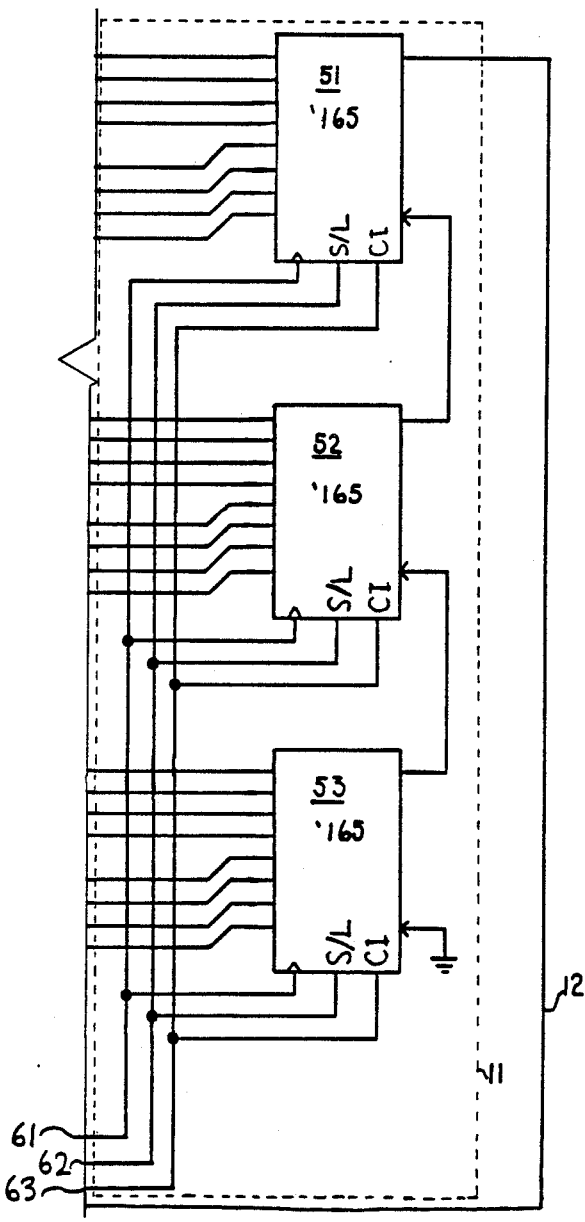

FIGS. 2a, 2b, and 2c show the elements of the invention of FIG. 1 in detail. In the preferred embodiment, the tester 13 is a Megatest Q2/52 memory tester, configured for a 256K×1 DRAM as the device under test (DUT). The DUT 21 and the reference device 22 are 256K×1 DRAMs. Tester 13 signals, FIG. 2a, are connected to these devices in parallel according to the chart below.

| Q2/52 | DRAM Signal |
|---|---|
| PE29 | A8 |
| PE38 | A7 |
| PE37 | A6 |
| PE36 | A5 |
| PE35 | A4 |
| PE34 | A3 |
| PE33 | A2 |
| PE32 | A1 |
| PE31 | A0 |
| PE21 | DIN |
| PE25 | DUT DOUT |
| PE12 | RAS |
| PE13 | CAS |
| PE11 | WE |
| V1 | DUT VCC* |

*Reference device $V_{CC}$ held at 5v.

The counter 10, FIG. 2b, comprises six cascaded 4-bit decade direct clear synchronous counter chips 31–36. These chips have a common clock and a common clear. The counter 10 clock is connected to the tester signal 14 (PE 14), FIG. 2a. The counter 10 clear is connected to a tester power supply 15 (V2), FIG. 2a. Each counter chip feeds a ripple carry into the count input of the next counter chip.

The flagbit latch 23 comprises a D-type flip-flop 41 and an OR gate 42, configured as shown in FIG. 2a. The flagbit latch 23 output connects to the tester input 16 (PE27). The flagbit latch 23 clear input is connected to the tester power supply 15.

The outputs of the DUT 21 and of the reference device 22 are XORed through XOR gate 17, the results being fed to the count input of the counter 10 and to the flagbit latch 23 as shown in FIG. 2a.

The shift register 11, FIG. 2c, comprises three cascaded parallel-load 8-bit shift register chips 51–53. These chips have common shift clock, shift/load, and clock inhibit inputs. The register 11 shifts the count to tester input 12 (PE 26).

The data outputs of the counter 10 are fed to the data inputs of the shift register 11 as shown in FIGS. 2b and 2c.

A tester output 61 (PE12) is connected to the shift register 11 shift clock, FIG. 2c. A tester output 62 (LPORT B6) is fed through an inverter 64, FIG. 2a, to the shift register 11 shift/load input. A tester output 63 (LPORT B7) is fed through an inverter 65, FIG. 2a, to the shift register 11 clock inhibit input.

Except for the DUT 21, all chip components in the circuit are powered by a constant 5 v supply (not shown). DUT 21 is powered by the tester so that low and high voltage tests can be conducted.

Figure 3:
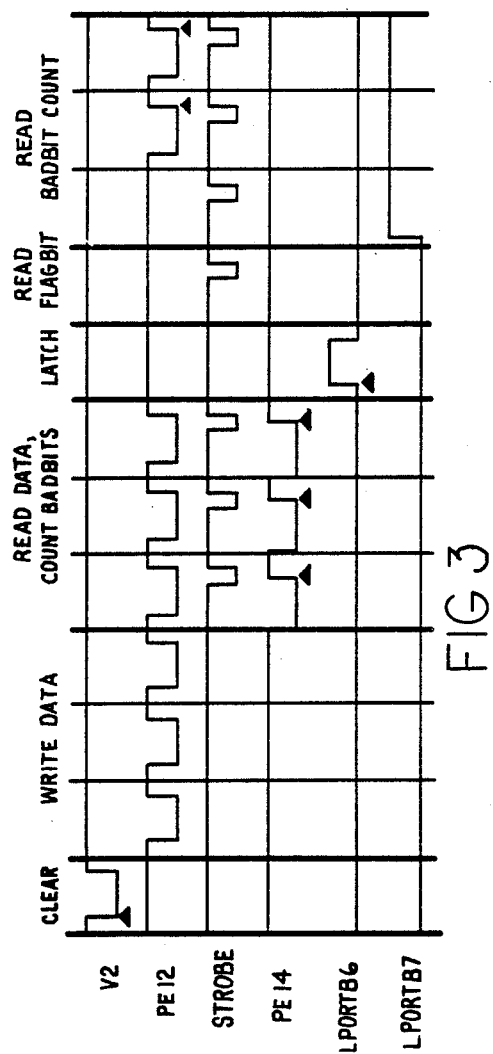
FIG. 3 is a timing diagram for the operation of the preferred embodiment.

Referring to FIG. 3, all functions of the badbit counter are controllable by tester 13.

The steps in operating the badbit counter are as follows.
 (1) Initialize/standby. Clear the badbit counter by bringing V2 15 down to 0 v. Enable the circuit by bringing V2 15 to 5 v again. LPORTB6 62 and LPORTB7 63 as seen by the tester 13 should be set to "0". Put PE14 14 to a "1" state.
 (2) Write data to DUT 21 and reference device 22. The badbit counter is inactive at this time.
 (3) Read data from DUT 21. Cause PE14 14 to have a positive transition within the time in each cycle that Data-out of the DUT 21 is valid. This will provide the synchronous counter chips with a clock 14, responding to the XOR 17 output only when that output is valid. If a badbit occurs, the XOR 17 output will be a "1" state when PE14 14 undergoes a positive transition, and the counter 10 will increment. Because LPORTB6 62 and LPORTB7 63 are at "0", the shift register 11 will ignore the signals on PE12 61.
 (4) Latch the badbit count into the shift register 11 by causing a positive transition on LPORTB6 62. Then put LPORTB6 62 back to a "0" state.
 (5) Read the flagbit through PE27 16.
 (6) If the flagbit is at a "0" state, the DUT 21 has no badbits. The test is done.
 (7) If the flagbit is at a "1" state, the DUT 21 has one or more badbits. The count needs to be read by the tester 13. Cause the first bit from the shift register 11 to be put on PE26 12 by putting a "1" state on LPORTB7 63. Putting a positive transition on PE12 61 while LPORTB7 63 is at a "1" state will cause the next bit to be put on PE26 12. Clock PE12 61 in this manner until all bits are read by the tester.

The foregoing is a description of a specific embodiment of the invention. Clearly, numerous variations can be made to the configuration within the scope of the invention. For example, other semiconductor arrays could be tested with the inventive arrangement. A DUT with more than one output could simply have an XOR gate for each output, the XOR outputs being ORed together into one counter. Alternatively, a multiple-output DUT could be treated as several DUTs, the preferred embodiment being duplicated for each output. The DUT could conceivably be a microprocessor. Analog devices could be DC-tested with this invention by running the DUT and reference device outputs through analog-to-digital converters and comparing the digital outputs as for a multiple-output DUT.

There are also a multitude of variations on this specific embodiment that do not substantially change its function, such as: use of positive versus negative logic; use of inverters as opposed to buffers (or vice versa); use of an XNOR gate instead of an XOR gate; use of elements with a large enough fanout so that buffering devices are unnecessary; use of synchronous versus asynchronous counting means; use of logical means to combine signals; use of extra signals to eliminate signal combinations; use of level-triggering versus edge-triggering; use of technologies such as CMOS versus TTL; use of means other than a shift register to convert data from one sense (such as parallel) to another sense (such as serial) in order to be recognizable by the tester; use of means other than the tester to recognize the count.

I claim:
1. Apparatus for real-time recognizing and counting of digital device badbits in which a digital device under test (DUT) has at least one output, the apparatus comprising:
 a reference device, having an operating format corresponding to that of the DUT;
 a tester, providing clocking to exercise the DUT;
 the DUT and the reference device responsive in parallel to the tester;
 a comparing device, having a first input responsive to the DUT output, having a second input responsive to the reference device output, and having an output signal whose first state indicates that the first and second inputs are equivalent, and whose second state indicates that the first and second inputs are not equivalent, said inequivalencies being called badbits;

a counter, having an input responsive to the comparing device output, counting badbits recognized by the comparing device;

a flagbit latch, responsive to an initial digital transition of the comparing device output, indicating the occurrence of at least one badbit;

the tester being responsive to one or more outputs of the apparatus;

a conversion device having at least one input of a first sense and at least one output of a second sense, the inputs responsive to the counter outputs, for converting the count from the first sense to the second sense, the tester being responsive in said second sense to the conversion device output.

2. Apparatus as described in claim 1, further comprising:

the comparing device including an XOR gate;

the flagbit latch including a two-input OR gate and a second D-type flip-flop, the flip-flop clock input responsive to the comparing device output, the flip-flop clock input responsive to the OR output, the flip-flop D input responsive to the comparing device output, the flip-flop clear input responsive to the second tester control signal, the first OR input responsive to the first tester control signal, the second OR input responsive to the flip-flop Q output, and the flip-flop Q output being the flagbit;

the conversion device including a parallel-in/serial-out shift register;

the counter including a synchronous digital counter.

3. Apparatus as described in claim 1, further comprising:

the comparing device including an XNOR gate.

4. Apparatus as described in claim 1, further comprising:

the counter including an asynchronous digital counter.

* * * * *